United States Patent [19]

Nezu

[11] Patent Number: 4,785,343
[45] Date of Patent: Nov. 15, 1988

[54] MIS FET SEMICONDUCTOR DEVICE WITH IMPROVED LEAKAGE CURRENT

[75] Inventor: Akio Nezu, Kawasaki, Japan

[73] Assignee: Fujitsu Limited, Kanagawa, Japan

[21] Appl. No.: 871,336

[22] Filed: Jun. 6, 1986

[30] Foreign Application Priority Data

Jun. 7, 1985 [JP] Japan ................... 60-123646

[51] Int. Cl.[4] ................ H01L 29/78; H01L 29/40
[52] U.S. Cl. ........................... 357/53; 357/52; 357/23.1; 357/23.8; 357/23.11; 357/23.14
[58] Field of Search ............ 357/23.14, 52, 23.8, 357/23.1, 23.11, 53

[56] References Cited

FOREIGN PATENT DOCUMENTS

| 0004238 | 3/1979 | European Pat. Off. ............ 357/41 |
| 53-132276 | 11/1978 | Japan ............................ 357/23.11 |
| 55-130170 | 10/1980 | Japan ............................ 357/23.11 |
| 57-154875 | 9/1982 | Japan ............................ 357/23.1 |
| 60-92667 | 5/1985 | Japan ............................ 357/23.14 |

*Primary Examiner*—William D. Larkins
*Assistant Examiner*—Jerome Jackson
*Attorney, Agent, or Firm*—Armstrong, Nikaido, Marmelstein & Kubovcik

[57] ABSTRACT

The present invention relates to a MIS FET having an additional gate electrode (referred to as a suppression gate electrode) which extends along a boundary region between a MIS FET active region and a field oxide film under a drain wiring. When the drain wiring is supplied with a voltage high enough to induce an inversion layer of the same polarity as the MIS FET channel, a parasitic transistor is formed in parallel with the MIS FET and creates an increase in leakage current. A suppression gate electrode of the present invention forms an interrupting transistor connected in series with the parasitic transistor and therefore cuts off the leakage current.

9 Claims, 5 Drawing Sheets

FIG. IA  PRIOR ART
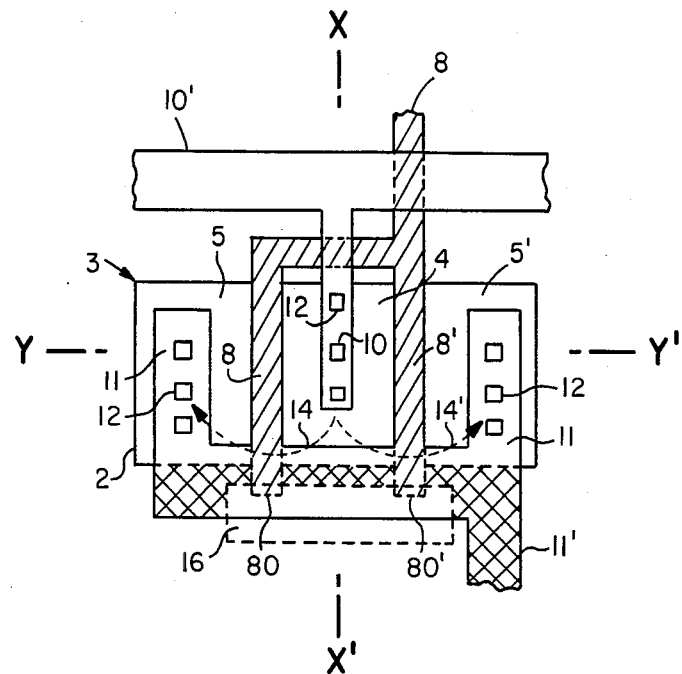
FIG. IB  PRIOR ART
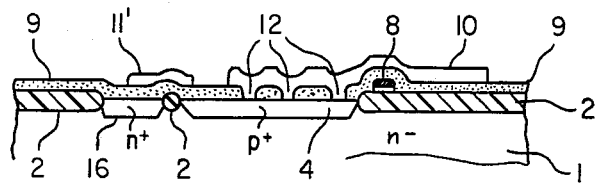
FIG. IC  PRIOR ART
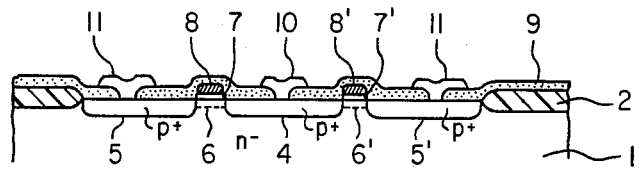

FIG. ID    PRIOR ART
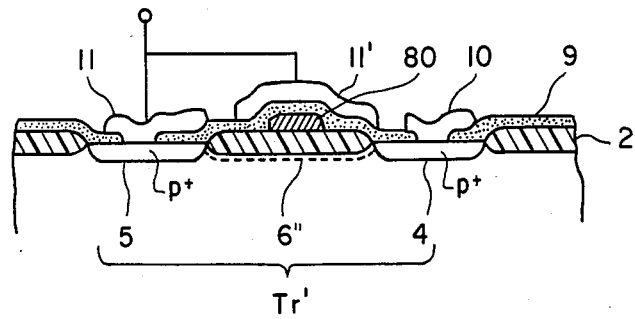
FIG. 2    PRIOR ART
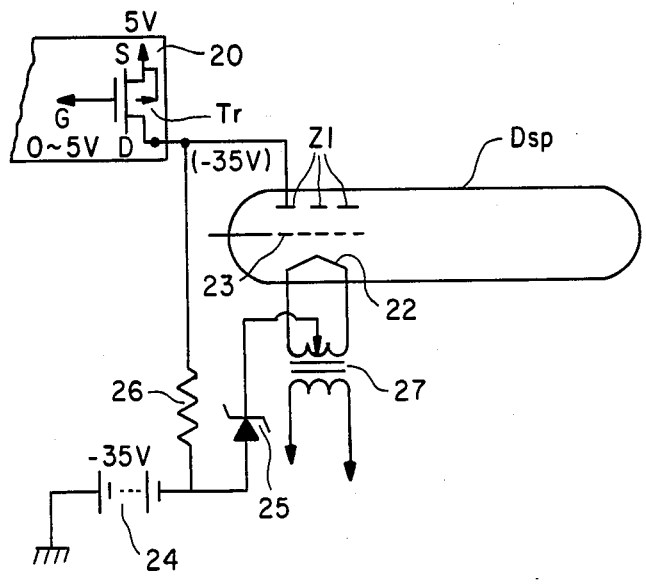

MIS FET SEMICONDUCTOR DEVICE WITH IMPROVED LEAKAGE CURRENT

BACKGROUND OF THE INVENTION

The present invention relates to a structure of a Metal Insulator Semiconductor Field Effect Transistor (denoted as MIS FET hereinafter). In particular, the present invention relates to a structure to reduce a leakage current caused by a parasitic transistor formed adjacent to an active region of the MIS FET.

Among FET semiconductor devices, MIS FETs (when an oxide film is used as the insulator, it is called as MOS FET) are frequently used. In order to get a large amount of output current from the MIS FET, it is necessary to design the device with a large gate width. For this reason many designs can be used.

When the MIS FET is incorporated in an IC (Integrated Circuit), interconnection wirings to the source and the drain electrodes are formed on a dielectric film formed over a substrate. In some cases, part of the wiring adjacent to the active region of the MIS FET induces an inversion layer beneath the surface of the substrate and forms a parasitic transistor which collaborates with the drain and source regions of the MIS FET.

If a high voltage is applied to the drain wiring, it induces the inversion layer, and the parasitic transistor gives rise to a leakage current. The present invention provides a pattern for a gate electrode which suppresses the above mentioned leakage current.

An example of a MIS FET of the prior art is shown in FIG. 1. FIG. 1A is a top view of twin MIS FETs having a common source, and FIG. 1B and FIG. 1C show cross-sectional views taken along chained lines X—X' and Y—Y' in FIG. 1A respectively.

The invention will be described hereinafter with respect to the twin MIS FETs, but it will be apparent to anyone skilled in the art that, it is not limited to such a structure and the invention is applicable to any type of FETs.

In FIG. 1, an n⁻ type substrate 1 is used, and a field oxide film 2 is formed on a surface of the substrate 1. The field oxide film 2 has an opening for an active region 3 of the MIS FET, which comprises a source region 4, two drain regions 5 and 5', and two channel regions 6 and 6'.

The channel regions 6 and 6' are covered with gate insulating films 7 and 7' respectively (they are usually oxide films), and polycrystalline silicone gate electrode 8 and 8' are formed thereon. The source and drain regions are formed by an ion implantation technique, for example, using the field oxide film 2 and the gate electrodes 8 and 8' as a mask. In this case, p+ type impurities are implanted into the MIS FET active region 3, and the p+ type regions of source and drain are formed.

After the formation of the source and drain regions, an insulating layer 9, a PSG (Phospho Silicate Glass) layer, for example, is formed by a CVD (Chemical Vapor Deposition) method. Contact windows 12 for the source and drain electrodes are formed in the insulating layer 9.

Subsequently an aluminum layer is deposited all over the surface of the substrate so that a source electrode 10, a source wiring 10', two drain electrodes 11 and a drain wiring 11' are formed by a selective etching process using photolithographic techniques.

The above mentioned MIS FET structure shown in FIG. 1 has two drain regions 5 and 5', one common source region 4 and two channel regions 6 and 6'. This design allows a large source to drain current $I_{DS}$ and consequently creates a large transconductance $g_m$ suitable for a p channel open-drain output circuit.

When the p channel MIS FET mentioned above is used in a driving circuit for a flourescent display tube, for example, a negative voltage of about $-35$ volts is supplied to the drain wiring 11'. FIG. 2 shows a circuit diagram of such an application.

In FIG. 2, Tr is a p channel MIS FET assembled in an IC 20; Dsp is a fluorescent display tube driven by IC 20, an anode electrode 21 of the display tube Dsp is connected to the output of the FET Tr, of which source, drain and gate electrodes are represented by S, D and G respectively. A negative terminal of a power supply 24 is connected to a center tap of a transformer 27, which is connected to a heater 22 of Dsp, via Zener diode 25, and is also connected to the drain D of Tr via a register 26. A connection of a grid electrode 23 of Dsp is not shown for simplicity.

When the MIS FET Tr is conductive a voltage drop of only a few volts occurs between the source S and drain D of the MIS FET Tr. Most of the voltage from the power supply 24 is applied to the fluorescent display tube Dsp.

When the gate voltage of Tr is driven to a cut off level, the voltage of the power supply is applied to the drain D of the MIS FET Tr. As shown in FIG. 2, when the negative voltage of the power supply 24 is $-35$ volts, for example, then the drain voltage of the MIS FET becomes almost $-35$ volts.

In FIG. 1A, when the voltage of drain wiring 11' becomes $-35$ volts, an inversion layer is formed on the cross shaded portion of the n⁻ substrate beneath the drain wiring 11'. A channel 6'' of the parasitic transistor Tr' is formed as shown in FIG. 1D, which shows a cross-sectional view taken along the dashed curve 14.

Dashed curves 14 and 14', shown with an arrow in FIG. 1A, indicate the directions of the current flow in the parasitic transistors as formed in the above example. The p channel parasitic transistor Tr', shown in FIG. 1D, is composed of a source region 4, a drain region 5, a channel region 6'', a gate electrode 80 (an elongated portion of the gate electrode 8 which will be explained later) and drain wiring 11' as a second upper gate electrode. The current flowing in these parasitic transistors causes a current leakage in the main transistor Tr.

The current leakage due to the parasitic transistor Tr' mentioned above can be reduced by any one of the following methods. The first method is to elongate the gate electrodes 8 and 8' straight across the area so they extend out of the MIS FET active region 3 and extend into the region of the cross shaded portion 11' as shown by dashed lines 80 and 80' of the gate electrodes 8 and 8'. This method suppresses the current leakage to some degree because of the positive voltage from the gate electrodes 80 and 80'.

A second method of reducing current leakage is by forming a channel stopper in the area where the parasitic transistor Tr' is formed. The n+ channel stopper 16, shown by the rectangular shaped dashed line in FIG. 1A, is formed by the ion implantation technology in the early stages of wafer process. The n+ channel stopper 16 prevents the substrate from inducing the inversion layer.

The above mentioned methods to reduce the leakage current are conventionally used in the art, but these methods are still not sufficient to completely shut off the leakage current. Regarding the first method, if the voltage applied to the drain wiring 11' is high compared with that of the gate electrode 80, the gate electrode cannot totally prevent the formation of the inversion layer, and, as a result, the channel 6" of the parasitic transistor Tr' is formed.

In the second method of suppressing the leakage current by the channel stopper 16, the preferred method is to form the channel stopper 16 as close as possible to the active region 3 of the MIS FET. Usually the channel stopper is formed directly under the field oxide film 2 which is in contact with the active regions. This method is well known as the LOCOS method.

Moreover in a transistor that is required to operate at high voltage levels, the channel stopper cannot be provided close to the active region, because it decreases the break-down voltage at the p-n junction of the drain or source regions 5, 5', 4 to the channel stopper 16.

As shown in FIG. 1A, the channel stopper 16 is formed in an opening window formed in the field oxide film 2 which is a short distance from the MIS FET active region 3. As a result of this configuration, the formation of the inversion layer and the resulting current leakage cannot be avoided.

The current leakage through the parasitic transistor will increase wasted power consumption and will cause the temperature of the MIS FET to rise. On the other hand, as a result of deterioration of the MIS FET characteristic the fluorescent display tube, for example, will continue to partially gleam on the display screen even when the MIS FET is cut off.

SUMMARY OF THE INVENTION

It is a primary object of the present invention to provide a FET in which leakage current is reduced.

Another object of the present invention is to provide a gate electrode pattern to minimize the leakage current caused by the parasitic transistor.

Still another object of the present invention is to provide a gate electrode to effectively shut off the flow of the leakage current through the parasitic transistor.

A further object of the invention is to provide a gate electrode pattern with no additional wafer processing to fabricate it.

The foregoing objects are attained by providing an additional gate electrode in the FET by extending the gate electrodes of the FET along the boundary region between the active region and the field oxide film of the MIS FET and under its drain wiring.

The parasitic transistor Tr', which gives rise to the leakage current, is considered to be connected in parallel with the MIS FET Tr. This is schematically shown in the equivalent circuit of FIG. 3A. In the prior art circuit, parasitic transistor Tr' is not completely cut off which results in a leakage current developing.

The present invention provides an additional extended gate electrode which is connected to the gate electrode of Tr. If the additional extended gate is provided in the source region of Tr, the parasitic transistor Tr' becomes a FET with a dual-gate. The function of Tr' in this case is readily understood by separating Tr' into two serially connected FETs of Tr1 and Tr2 as shown in FIG. 3B.

In the first embodiment of the present invention, the gate of the first transistor Tr1 is composed of the drain wiring. The gate of the second transistor Tr2 is composed of the extended gate of the main transistor Tr. Tr2's function is to interrupt the current leakage.

In the second embodiment the extended gate electrode is applied to the drain region. The parasitic transistor Tr' may be considered divided into Tr1 and Tr3 which are connected in series as shown in FIG. 3C.

In the third embodiment, the extended gate electrode is applied to both the source and the drain regions. The parasitic transistor Tr' may be considered as three transistors Tr1, Tr2, and Tr3 connected in series, which is shown in FIG. 3D.

When the main MIS FET Tr is driven to a cut off level, Tr2 or Tr3 becomes non-conductive and interrupt the leakage, current of Tr1. This occurs even if Tr1 becomes conductive due to a negative high voltage of the drain wiring.

These examples, together with other objects and advantages, will become apparent subsequently as more details of construction are hereinafter described and claimed. References are made to the accompanying drawings and form a part hereof, wherein like numerals refer to like parts throughout.

BRIEF DESCRIPTION OF THE DRAWINGS

FIG. 1A shows a top view of a pattern of a MIS FET of the prior art.

FIGS. 1B through 1D show a cross-sectional view of the MIS FET taken along chained lines X—X', Y—Y', and a dashed curve 14 respectively in FIG. 1A.

FIG. 2 is a circuit diagram showing an application of a MIS FET used as a driver of a fluorescent display tube.

FIG. 3A shows an equivalent circuit diagram in which the parasitic transistor Tr' is formed in parallel with the main transistor Tr in a prior art circuit;

FIG. 3B shows an equivalent circuit diagram for a first embodiment of the invention in which the gate electrode of the additional transistor Tr2 is provided in the source region of the main transistor Tr;

FIG. 3C shows an equivalent circuit diagram for a second embodiment of the invention in which the gate electrode of the additional transistor Tr3 is provided in the drain region of the main transistor Tr;

FIG. 3D shows an equivalent circuit diagram for a third embodiment of the invention in which the gate electrodes of additional transistors are provided in both the source and drain regions of the main transistor Tr.

DETAILED DESCRIPTION OF PREFERRED EMBODIMEMT

Figure 4A:
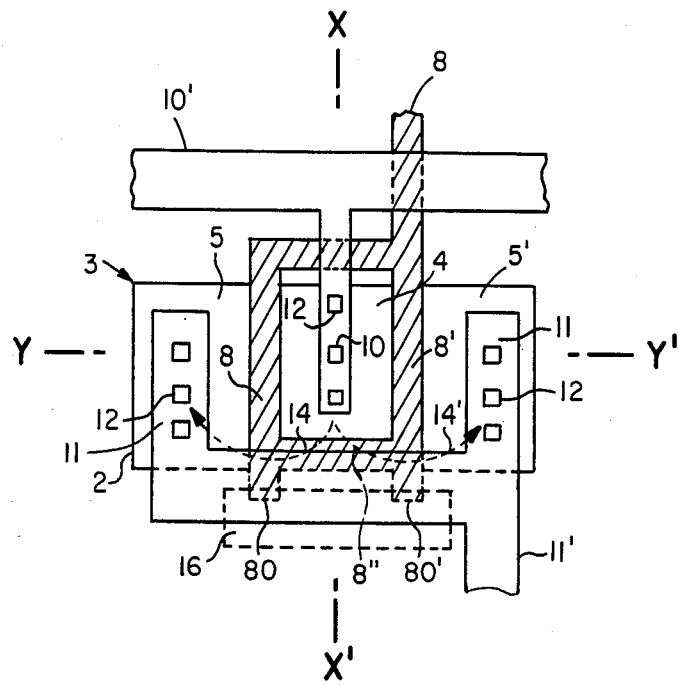
FIG. 4A shows a top view of a pattern for a MIS FET of a first embodiment of the present invention, wherein the extended gate is applied in the source region of the FET.
Figure 4B:
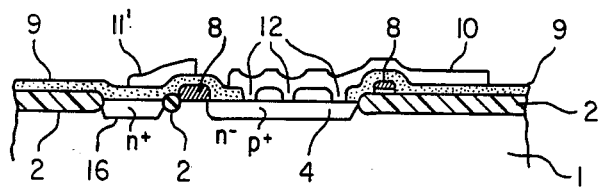
FIGS. 4B through 4D show a cross-sectional view taken along chained lines X—X', Y—Y', and a dashed curve 14 respectively in FIG. 4A.
Figure 4C:
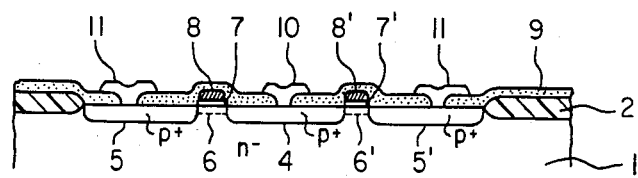
Figure 4D:
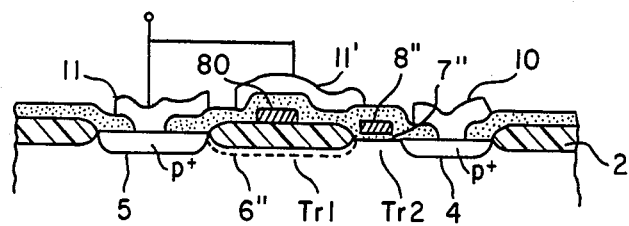
Figure 5:
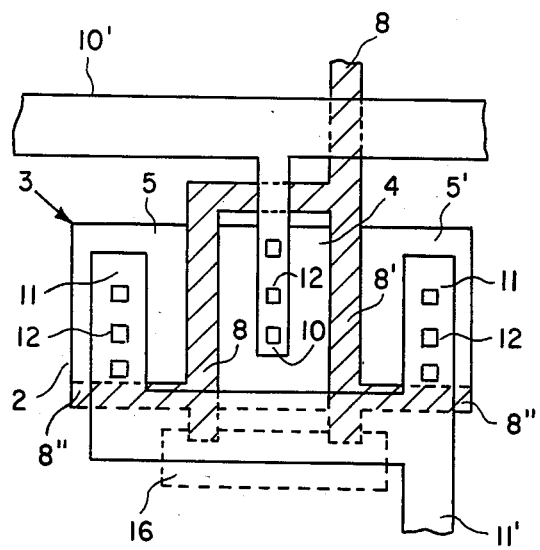
FIG. 5 shows a top view of a pattern for a MIS FET of a second embodiment of the present invention, wherein the extended gate is applied in the drain region of the main FET.
Figure 6:
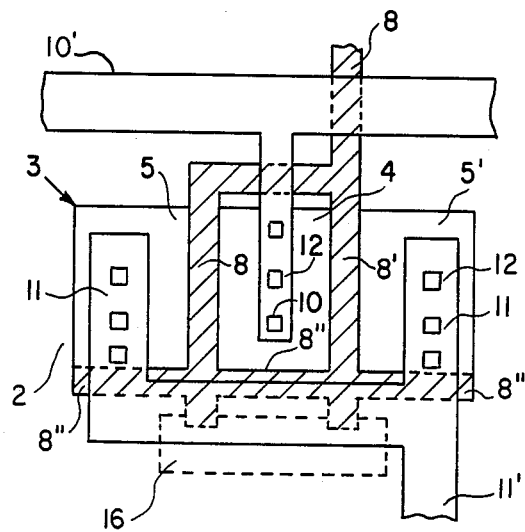
FIG. 6 shows a top view of a MIS FET of a third embodiment of the present invention, wherein the extended gate is applied in both source and drain regions of the main FET.

Referring to the drawings of FIGS. 4 through 6, the same or like reference numerals are used to identify similar or corresponding parts as in the prior art of FIG. 1.

Referring to FIGS. 4A through 4D, an n⁻ type silicon substrate is used. The substrate 1 is covered with a double layer of silicon dioxide and silicon nitride films (not shown), and then the layer is selectively etched off in the field oxide film region. Subsequently the substrate is subject to oxidization. The field oxide film 2, having a thickness of from 3000 to 5000 Å, is grown all over the surface of the substrate 1, so that openings for a MIS FET active region 3 and a channel stopper region 16' (a channel stopper 16 is formed later) are automatically formed.

Unlike the usual case, the channel stopper region 16' is not formed around the active region 3, but is formed only at a portion parallel to one edge of the active region 3.

The size and position of the channel stopper region 16' can be determined after taking into consideration the break down voltage between the channel stopper 16 and the active region 3. It is desirable to design the channel stopper 16 as wide as possible beneath the drain wiring 11' to prevent the growth of the inversion layer caused by voltage applied to the drain wiring 11'.

Thereafter the double layer of silicon dioxide and silicon nitride films are removed. The substrate is again subjected to thermal oxidization and then a silicon oxide film, having a thickness of from 300 to 1000 Å, is formed over the substrate. Then a polycrystalline silicon layer is deposited on the substrate by chemical vapor deposition (CVD) to a thickness of from 4000 to 5000 Å.

The silicon dioxide film and the polycrystalline silicon layer are selectively removed by conventional photolithography techniques. Plasma etching is used to selectively remove the polycrystalline silicon layer, and an etching solution containing HF (hydrofluoric acid) is used to selectively remove the silicon dioxide film.

The silicon dioxide film thus formed on the channel region 6 and 6' is called a gate oxide film 7 and 7'. The polycrystalline silicon layer remaining on the gate oxide film is respectively called gate electrodes 8 and 8', and an additional extended gate electrode 8'' which extends along the boundary of the active region 3. The electrodes are connected by an interconnection wiring 8 to form an IC.

The fabrication processes for the gate electrodes 8, 8' and 8'', and wiring 8 are well known in the art of a MOS FET gate fabrication process. Comparing the pattern of FIG. 4A with that of FIG. 1A, the pattern of FIG. 4A has an additional extended gate electrode 8'' which hereinafter will be called a suppression gate electrode.

As shown in FIG. 4A, the suppression gate electrode 8'' is connected at either end to gate electrodes 8 and 8' and extends along the boundary region between the MIS FET active region 3 and the field oxide region 2. The pattern width of the suppression gate electrode is not critical, and may be the same as that of electrode 8 and 8'.

The suppression gate electrode 8'', shown in FIG. 4, is formed on the gate oxide film 7'' in the active region 3 of the MIS FET. However the formation of the gate 8'' in the active region 3 is not critical and it is possible to form the suppression gate electrode 8'' partially on the field oxide film 2 along the boundary region.

After the suppression gate electrode 8'' is formed, n type impurity ions such as phosphorus or arsenic ions are selectively implanted for the channel stopper region 16 using preferably a dose of $3 \times 10^{12}/cm^2$ and an implantation energy of approximately 80 KeV.

Thereafter, p type ions, such as boron ions, are implanted selectively for the source region 4 and the drain regions 5 and 5' using preferably a dose of $(5-10) \times 10^{14}/cm^2$ and an implantation energy of approximately 60 KeV.

Subsequently a PSG layer 9 is deposited on the entire surface of the substrate by a CVD method to protect and insulate the surface of the device. The contact windows 12 for the source and drain regions 4, 5, 5' are formed by photolithography. Then, an aluminum layer is deposited on the entire surface, and selectively etched forming the source electrode 10 and wiring 10', and the drain electrode 11 and wiring 11' by well known photolithographic processes.

FIGS. 4B and 4C show a cross-sectional view taken along line X—X' and Y—Y' respectively. A dashed curve 14 with an arrow shows the direction of the current flow in a parasitic transistor Tr' as explained in the prior art. FIG. 4D shows a cross-sectional view along the dashed curve 14.

Figure 3A:
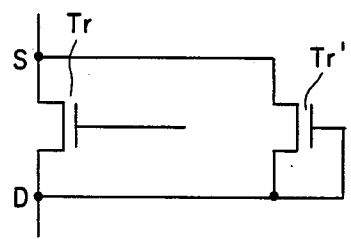
FIGS. 3A through 3D show equivalent circuit diagrams of the MIS FET illustrating a parasitic transistor and an additional transistor to prevent a leakage current where.
Figure 3B:
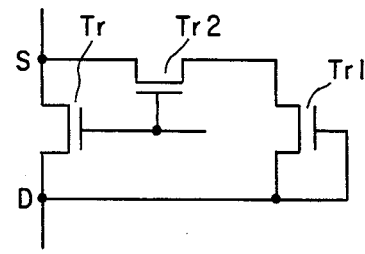

Comparing FIG. 4D with FIG. 1D, the parasitic transistor Tr' has a suppression gate electrode 8'' formed adjacent the source region 4. As previously described, when the main MIS FET Tr is non-conductive, the suppression gate electrode 8'' forms an interrupting transistor Tr2 and functions to prevent the formation of an inversion layer since the suppression gate electrode 8'' is formed at a position which shields a surface of the substrate from the drain wiring 11' as shown in FIG. 4D. Therefore, even if the inversion layer is induced and a channel 6'' is formed beneath the gate electrode 80 and the drain wiring 11', the suppression gate 8'' cuts off the channel 6'' and interrupts the current leakage from the source region 4 to the drain region 5. FIG. 3B is the equivalent circuit diagram for a structure shown in FIG. 4.

On the other hand, when the main MIS FET Tr is in the conductive state, the interruption transistor Tr2 is also conductive which means no problems are caused.

FIG. 5 shows a second embodiment of the present invention having a different pattern for the suppression gate electrode. Referring to FIG. 5, the formation of the suppression gate electrode 8'' is provided over the drain regions 5 and 5'. Therefore, the suppression gate electrode 8'' has the form of an outside extension from the electrodes 8 and 8' in opposite directions respectively.

Figure 3C:
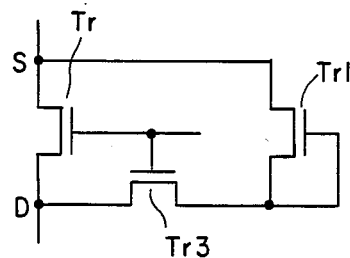

Except for the gate formation of the MIS FET, the structure of FIG. 5 is almost the same as that of FIG. 4. The suppression gate electrode 8'' is formed on the side opposite of the one shown in FIG. 4D. The interrupting transistor Tr3 is then formed at the drain side of the main MIS FET. An equivalent circuit of FIG. 5 is shown as FIG. 3C.

Figure 3D:
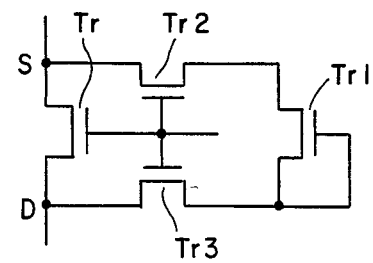

The third preferred embodiment of the present invention is shown in FIG. 6. This embodiment combines the structures shown in FIGS. 4 and 5. Two suppression gate electrodes 8'' are provided on both sides of the source 4 and drain regions 5 and 5'. Therefore, the parasitic transistor Tr' has two suppression gate electrodes 8''. An equivalent circuit diagram is shown as FIG. 3D. Two interrupting transistors Tr2 and Tr3 are formed in series, and more effectively shut off the current leakage.

Among the three embodiments of the present invention, the embodiment shown in FIG. 6 is more effective in suppressing the leakage current than the other two embodiments.

It should be apparent to anyone skilled in the art that the embodiments as herein disclosed with respect to a p channel MIS FET can be easily modified for an n channel MIS FET by reversing the conductivity type and the polarity of the applied voltage.

This invention can be extended or modified in various ways without departing from the spirit or essential characteristics thereof. For instance, the channel stopper described with respect to the embodiments are not limited to the form illustrated in the figures. It is possible to form a channel stopper surrounding the MIS FET active region 3, or to form the channel stopper directly under the field oxide film. The form of source and drain regions and the pattern of each electrode and wiring may also be modified. The preferred embodiments herein are therefore illustrative and not restrictive.

I claim:

1. A MIS FET semiconductor device comprising:
a semiconductor substrate of a first conductivity type;
an active region formed in said substrate and composed of a source region, a drain region and a channel region disposed between said source and drain regions, said source region and drain region of a second conductivity type opposite the first conductivity type;
a field oxide film formed on said substrate and surrounding said active region;
a gate insulating film formed on said channel region, and having a thickness thinner than said field oxide film;
a gate electrode formed on said gate insulating film such that said gate electrode extends across the active region and extends onto the field oxide film at one end thereof, and such that a portion of said gate electrode at an opposite end thereof, overlies said field oxide film and is spaced apart from said active region;
an insulating layer covering the entire surface of said substrate;
a drain electrode formed on said insulating layer connected to said drain region through contact holes formed in said insulating layer;
a drain wiring formed on said insulating layer and connected to said drain electrode, said drain wiring extending above two regions, the first region including a first boundary region between the source region and the field oxide region, and a narrow area in the active region abutting said first boundary region, and the second region including a second boundary region between the drain region and the field oxide region, and a narrow area in the active region abutting said second boundary region, said first and second regions being located on both sides of said channel region, where said source and drain regions extend to said first and second boundary regions at said one end, and extend to said field oxide film at said other end;
a suppression gate insulating film formed on at least one of said first and second boundary regions and having a thickness substantially the same as the thickness of the gate insulating film, and;
a suppression gate electrode extending from said gate electrode and disposed over at least one of said first and second boundary regions and on said suppression gate insulating film in said active region near said one end of said gate electrode, said suppression gate formed beneath said insulating layer and substantially under said drain wiring.

2. A MIS FET semiconductor device according to claim 1, wherein said suppression gate electrode is formed along said second region.

3. A MIS FET semiconductor device according to claim 1, wherein said suppression gate electrode is formed along said second region.

4. A MIS FET semiconductor device according to claim 1, wherein said suppression gate electrode is formed along both said first and second regions.

5. A MIS FET semiconductor device according to claim 1, wherein said suppression gate electrode has a width greater than the boundary region between said active region and said field oxide region, and said suppression gate electrode includes an adjacent narrow region superposed above said active region.

6. A MIS FET semiconductor device according to claim 1, wherein said suppression gate electrode has a width greater than the boundary region between said active region and said field oxide region, and said suppression gate electrode includes an adjacent narrow region superposed above said field oxide region.

7. A MIS FET semiconductor device according to claim 1, further comprising a channel stopper being formed under said field oxide film.

8. A MIS FET semiconductor device according to claim 1, further comprising a channel stopper being formed in an opening of said field oxide.

9. A MIS FET semiconductor device according to claim 1, wherein said gate insulating film is a silicon dioxide film.

* * * * *